US010971388B2

(12) United States Patent
LaBrie et al.

(10) Patent No.: US 10,971,388 B2
(45) Date of Patent: Apr. 6, 2021

(54) CHUCK FOR EDGE BEVEL REMOVAL AND METHOD FOR CENTERING A WAFER PRIOR TO EDGE BEVEL REMOVAL

(71) Applicant: Lam Research Corporation, Fremont, CA (US)

(72) Inventors: Aaron Louis LaBrie, Sherwood, OR (US); Robert Lynden Braendle, Salem, OR (US); Cian Owen Sweeney, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/509,472

(22) Filed: Jul. 11, 2019

(65) Prior Publication Data

US 2019/0341291 A1    Nov. 7, 2019

Related U.S. Application Data

(62) Division of application No. 15/092,222, filed on Apr. 6, 2016, now Pat. No. 10,373,858.

(51) Int. Cl.
*H01L 21/02* (2006.01)
*H01L 21/683* (2006.01)
(Continued)

(52) U.S. Cl.
CPC .... *H01L 21/6838* (2013.01); *H01L 21/02041* (2013.01); *H01L 21/6708* (2013.01); *H01L 21/68728* (2013.01)

(58) Field of Classification Search
CPC .......... H01L 21/02041; H01L 21/6708; H01L 21/6838; H01L 21/68728
See application file for complete search history.

(56) References Cited

U.S. PATENT DOCUMENTS 3,523,706 A   8/1970 Logue
3,717,381 A   2/1973 Hagler
(Continued)

FOREIGN PATENT DOCUMENTS

CN   107342245 A   11/2017
EP   1091389 A2    4/2001
(Continued)

OTHER PUBLICATIONS

"U.S. Appl. No. 15/092,222, Non Final Office Action dated Aug. 27, 2018", 11 pgs.
(Continued)

*Primary Examiner* — Douglas Lee
(74) *Attorney, Agent, or Firm* — Schwegman Lundberg & Woessner, P.A.

(57) ABSTRACT

A chuck useful for supporting a wafer during an edge bevel removal (EBR) process comprises a rotatable center hub having a plurality of support arms extending outwardly from the rotatable center hub, support pins on ends of the support arms, gas passages extending through upper surfaces of the support pins, and gas conduits in the support arms. The gas conduits supply gas to the gas passages or apply a vacuum to the gas passages. The support arms can include alignment cams which are rotatable from an outer non-alignment position away from a periphery of the wafer to an inner alignment position at which the wafer is centered. During centering, the wafer is floated on a gas cushion which reduces wear of the support pins.

20 Claims, 3 Drawing Sheets

(51) Int. Cl.
*H01L 21/67* (2006.01)
*H01L 21/687* (2006.01)

(56) References Cited

U.S. PATENT DOCUMENTS

| | | | |
|---|---|---|---|
| 3,976,330 A | 8/1976 | Babinski et al. | |
| 4,024,944 A | 5/1977 | Adams et al. | |
| 4,219,110 A | 8/1980 | Ubukata | |
| 4,242,038 A | 12/1980 | Santini et al. | |
| 5,492,566 A | 2/1996 | Sumnitsch | |
| 5,967,578 A | 10/1999 | Frey | |
| 6,099,056 A | 8/2000 | Siniaguine et al. | |
| 6,109,677 A | 8/2000 | Anthony | |
| 6,152,507 A | 11/2000 | Pirker | |
| 6,156,167 A | 12/2000 | Patton et al. | |
| 6,167,893 B1 | 1/2001 | Taatjes et al. | |
| 6,217,034 B1 | 4/2001 | Smedt et al. | |
| 6,309,981 B1 | 10/2001 | Mayer et al. | |
| 6,363,623 B1 | 4/2002 | Abraham | |
| 6,402,843 B1 | 6/2002 | Siniaguine et al. | |
| 6,405,101 B1 | 6/2002 | Johanson et al. | |
| 6,537,416 B1 | 3/2003 | Mayer et al. | |
| 6,578,853 B1 | 6/2003 | Treur et al. | |
| 6,601,888 B2 | 8/2003 | Mcilwraith et al. | |
| 6,932,558 B2 | 8/2005 | Wu | |
| 7,087,122 B2 | 8/2006 | Smith et al. | |
| 7,284,760 B2* | 10/2007 | Siebert | H01L 21/68707 118/500 |
| 7,780,867 B1 | 8/2010 | Mayer et al. | |
| 7,866,058 B2 | 1/2011 | Kim et al. | |
| 8,277,165 B2 | 10/2012 | Tabrizi et al. | |
| 8,419,964 B2 | 4/2013 | Ganesan et al. | |
| 8,490,660 B2 | 7/2013 | Koelmel et al. | |
| 8,530,359 B2 | 9/2013 | Mayer et al. | |
| 8,764,026 B2 | 7/2014 | George et al. | |
| 9,117,856 B2 | 8/2015 | Goodman et al. | |
| 9,233,455 B2 | 1/2016 | Ooi | |
| 10,373,858 B2 | 8/2019 | LaBrie et al. | |
| 2002/0106445 A1* | 8/2002 | Mito | H01L 21/6838 427/58 |
| 2003/0070915 A1 | 4/2003 | Kao | |
| 2003/0110658 A1 | 6/2003 | Treur | |
| 2003/0168174 A1* | 9/2003 | Foree | C23C 16/4584 156/345.51 |
| 2005/0110291 A1 | 5/2005 | Klein et al. | |
| 2009/0252582 A1 | 10/2009 | Bluck et al. | |
| 2009/0283499 A1 | 11/2009 | Mayer et al. | |
| 2010/0055924 A1* | 3/2010 | Ganesan | H01L 21/02087 438/748 |
| 2010/0219920 A1* | 9/2010 | Feng | H01L 21/68728 335/288 |
| 2015/0179495 A1 | 6/2015 | Huang | |
| 2016/0049326 A1* | 2/2016 | Onishi | B25J 11/0095 294/188 |
| 2017/0294332 A1 | 10/2017 | LaBrie et al. | |

FOREIGN PATENT DOCUMENTS

| | | |
|---|---|---|
| KR | 20170114935 A | 10/2017 |
| TW | 201803009 A | 1/2018 |
| WO | WO-9941022 A1 | 8/1999 |

OTHER PUBLICATIONS

"U.S. Appl. No. 15/092,222, Notice of Allowance dated Apr. 5, 2019", 8 pgs.

"U.S. Appl. No. 15/092,222, Response filed May 17, 2018 to Restriction Requirement dated Mar. 22, 2018", 1 pg.

"U.S. Appl. No. 15/092,222, Response filed Dec. 6, 2018 to Non Final Office Action dated Aug. 27, 2018", 15 pgs.

"U.S. Appl. No. 15/092,222, Restriction Requirement dated Mar. 22, 2018", 7 pgs.

"Contactless Gripper with Ultrasonic Air Cushion", CSEM, 1 pg.

Taiwanese Application Serial No. 106110459, Office Action dated Aug. 14, 2020, w/ English Translation, 13 pgs.

"Taiwanese Application Serial No. 106110459, Response filed Nov. 13, 2020 to Office Action dated Aug. 14, 2020", English Translation, 23 pgs.

\* cited by examiner

CHUCK FOR EDGE BEVEL REMOVAL AND METHOD FOR CENTERING A WAFER PRIOR TO EDGE BEVEL REMOVAL

CLAIM OF PRIORITY

This application is a divisional of and claims the benefit of priority under 35 U.S.C. § 120 to U.S. patent application Ser. No. 15/092,222, filed on Apr. 6, 2016, which is incorporated by reference herein in its entirety.

FIELD OF THE INVENTION

This invention relates to chuck technology for supporting semiconductor wafers. More particularly, it pertains to a method of centering a wafer prior to an edge bevel removal (EBR) process wherein liquid etchants remove unwanted metal for the outer edge of a wafer.

BACKGROUND

In a typical copper Damascene process, the formation of the desired conductive routes generally begins with a thin physical vapor deposition (PVD) of the metal, followed by a thicker electrofill layer (which is formed by electroplating). The PVD process is typically sputtering. In order to maximize the size of the wafer's useable area (sometimes referred to herein as the "active surface region") and, thereby, maximize the number of integrated circuits produced per wafer), the electrofilled metal must be deposited to very near the edge of the semiconductor wafer. Thus, it is necessary to allow physical vapor deposition of the metal over the entire front side of the wafer. As a byproduct of this process step, PVD metal typically coats the front edge area outside the active circuit region, as well as the side edge, and to some degree, the backside.

Electrofill of the metal is much easier to control, since the electroplating apparatus can be designed to exclude the electroplating solution from undesired areas such as the edge and backside of the wafer. One example of plating apparatus that constrains electroplating solution to the wafer active surface is the SABRE™ clamshell electroplating apparatus available from Novellus Systems, Inc. of San Jose, Calif. and described in U.S. Pat. No. 6,156,167 "Clamshell Apparatus For Electrochemically Treating Semiconductor Wafers," by E. Patton et al., and filed Nov. 13, 1997, which is herein incorporated by reference in its entirety.

The PVD metal remaining on the wafer edge after electrofill is undesirable for various reasons. For example, the PVD metal on the wafer edge is not suitable for subsequent depositions and tends to flake off generating undesirable particles. By contrast the PVD metal on the active interior region of the wafer is simply covered with thick and even electrofill metal and planarized by CMP down to the dielectric. This flat surface, which is mostly dielectric, is covered with a barrier layer, such as silicon nitride or silicon carbide, that both adheres well to the dielectric and aids in the adhesion of subsequent layers. Unfortunately, the barrier layer, which like the residual PVD metal layers deposits over the wafer edge area, is often thin and uneven and therefore may allow migration of the metal into the dielectric. This problem is especially important when the metal is copper.

To address these problems, semiconductor equipment may have to allow etching of the unwanted residual metal layers. Various difficulties will be encountered in designing a suitable etching system. For example, one of the main constraints of edge bevel removal (EBR) is a relatively long processing time. Smaller node technology allows significant reduction of plating time for thin films. In order to realize the throughput gain, it is highly desirable to reduce duration of all non-plating processes, such as EBR. Additional problems include controlling the etching area during the EBR process. It is desirable to minimize losses of electro-filled metal in the active area of the wafer while completely removing the surrounding bevel (i.e. to reduce "taper width" of the deposited metal). Overall, improved edge bevel removal methods and apparatuses are desired. Commonly assigned U.S. Pat. No. 8,419,964 "Apparatus And Method For Edge Bevel Removal Of Copper From Silicon Wafers," by K. Ganesan et al., and filed Aug. 27, 2008, which is herein incorporated by reference, discloses an apparatus for performing EBR wherein a wafer is supported on a rotatable chuck having support pins and alignment pins. A suitable chuck is described in commonly assigned U.S. Pat. No. 6,537,416 "Wafer Chuck For Use In Edge Bevel Removal Of Copper From Silicon Wafers," by S. Mayer et al., and filed Apr. 25, 2000, which is herein incorporated by reference. During wafer centering, a wafer slides on rubber support pins which can lead to wear and particle problems. It would be desirable to extend the wear of the support pins and reduce particle generation during wafer centering.

SUMMARY OF THE INVENTION

According to an embodiment, a method of centering a semiconductor wafer prior to an edge bevel removal (EBR) process comprises: (a) transferring a wafer above a rotatable chuck having at least three support arms with support pins at outer portions of the support arms, (b) lowering the wafer onto the support pins, (c) supplying pressurized gas to gas passages having gas outlets in an upper surface of the support pins such that the wafer floats on gas cushions formed by gas flowing out of the gas outlets in the upper surfaces of the support pins, (d) centering the wafer by moving the wafer across the support pins while the wafer floats on the gas cushions, (e) applying vacuum to the gas passages such that the wafer is vacuum clamped to the support pins.

After centering, the method can further comprise (f) rotating the wafer; (g) prerinsing the wafer using a prerinse liquid comprising deionized water; (h) thinning a layer of the prerinse liquid by increasing a rotational speed of the wafer; and (i) delivering a stream of liquid etchant into the thinned layer of prerinse liquid near an edge bevel area of the wafer such that the liquid etchant diffuses through the thinned layer of prerinse liquid and substantially removes unwanted metal selectively from the edge bevel area.

In an embodiment, the chuck includes six support arms, each of the support arms having a gas delivery conduit in fluid communication with a respective one of the gas passages in the support pins, wherein during (c) gas flows out of the gas outlets in the upper surfaces of the six support pins and during (e) vacuum is applied to each of the six gas passages.

In an embodiment, the support pins are elastomeric suction cups which have a tendency to stick to the wafer when the wafer is slid across the support pins. This causes the wafer to "stick and slip" which creates particles. By flowing nitrogen gas out of the suction cups, it is possible to reduce wear of the suction cups and prevent particle generation during centering (or moving) the wafer over the support pins. The flow of nitrogen gas out of the suction cups also eliminates curling or rolling of the lip seal style support pins.

Preferably, the gas is delivered to the gas passages at a pressure of at least one psi.

The support arms can include rotatable alignment cams, wherein during (d) the alignment cams are rotated from an outer position away from a periphery of the wafer to an inner position at which the wafer is centered. The support arms preferably extend outwardly from a rotatable center hub, the rotatable center hub having a gas inlet and a plurality of gas delivery ports in fluid communication with gas delivery conduits in the support arms, wherein during (c) gas is supplied to the gas inlet and flows out of the gas delivery ports to the gas passages in the support pins. To hold the wafer, in (e) a vacuum force is applied to the gas inlet and suction is applied to locations on an underside of the wafer by the support pins. The alignment cams can include upper pivot connections and lower pivot connections, wherein during (d) the alignment cams are rotated about the upper pivot connections by rods attached to the lower pivot connections. Preferably, the alignment cams are pivotally attached to the support arms so as to be movable between alignment positions at which upper portions of the alignment cams center the wafer and non-alignment positions at which the upper portions of the alignment cams are located below the wafer. To dry the wafer, the method further includes (j) rotating the alignment cams to the alignment positions and (k) drying the wafer by rotating the wafer at a drying speed of at least 750 rpm while applying vacuum to the gas passages such that the wafer is vacuum clamped to the support pins.

According to a further embodiment, a chuck useful for supporting a wafer during an edge bevel removal (EBR) process, comprises a rotatable center hub having a plurality of support arms extending outwardly from the rotatable center hub, support pins on ends of the support arms, gas passages extending through upper surfaces of the support pins, and gas conduits in the support arms, the gas conduits configured to supply gas to the gas passages or apply a vacuum to the gas passages.

The chuck can include six support arms, each of the support arms having a gas delivery conduit in fluid communication with a respective one of the gas passages in the support pins. Preferably, the support pins are rubber cups fitted on metal supports located at ends of the support arms. The metal supports can have vertically extending bores therein connecting the gas conduits in the support arms to the gas passages in the support pins.

The support arms can include alignment cams which are rotatable from an outer non-alignment position away from a periphery of the wafer to an inner alignment position at which the wafer is centered. To supply gas or apply a vacuum force to the gas outlets in the support pins, the rotatable center hub can have a gas inlet and a plurality of gas delivery ports in fluid communication with the gas delivery conduits in the support arms. Gas can be supplied to the gas outlets by a source of pressurized gas connected to the gas inlet and suction can be applied to the gas outlets by a vacuum source connected to the gas inlet.

The alignment cams can include upper pivot connections and lower pivot connections, wherein the rotatable cams are rotatable about the upper pivot connections by rods attached to the lower pivot connections. In one arrangement, the chuck includes six support arms located at radial positions of 60° 120°, 180°, 240°, 300° and 360°, the support arms at 60°, 180° and 300° including the alignment cams and the support arms at 120°, 240° and 360° not including the alignment cams. The support arms having alignment cams can include upper arms with the gas delivery conduits therein and lower arms having actuating rods therein, the actuating rods attached to the alignment cams such that the alignment cams are rotated toward the periphery of the wafer when ends of the actuating rods move outward from the center hub and are rotated away from the periphery of the wafer when ends of the actuating rods move towards the center hub.

DETAILED DESCRIPTION OF THE PREFERRED EMBODIMENTS

In the following detailed description, numerous specific embodiments are set forth in order to provide a thorough understanding of embodiments described herein. However, as will be apparent to those skilled in the art, the claimed invention may be practiced without these specific details or by using alternate elements or processes. In other instances well-known processes, procedures and components have not been described in detail so as not to unnecessarily obscure aspects of the claimed invention.

A "semiconductor wafer" as referred to herein is a semiconductor substrate at any of the various states of manufacture in the production of integrated circuits. One standard semiconductor wafer described in this invention is 300 mm in diameter, 0.75 mm in thickness, with an approximate radius of curvature of about 0.15 millimeters (see SEMI Specification M1.15-0997). Of course, semiconductor wafers of other dimensions, such as a standard 200 mm diameter silicon wafers, can also be used (see SEMI Specification M1-0298). Many process parameters disclosed herein are dependent on wafer size. For example, rotational speeds are specified for 300 mm and are inverse proportional to other diameters. Therefore, rotational speed of 400 rpm for a 300 mm wafer will be generally equivalent to 600 rpm for a 200 mm wafer.

In embodiments described below, an improved wafer chuck is described which can provide extended wear capabilities of support pins and reduced particle generation during wafer processing in a post-electrofill module" (PEM) designed to carry out edge bevel removal (EBR) and additional processes such as pre-rinsing, rinsing, acid washing, and drying. The post-electrofill module (PEM) can be used to carry out various process steps following electro-filling of copper on a wafer via a Damascene process.

Figure 1:
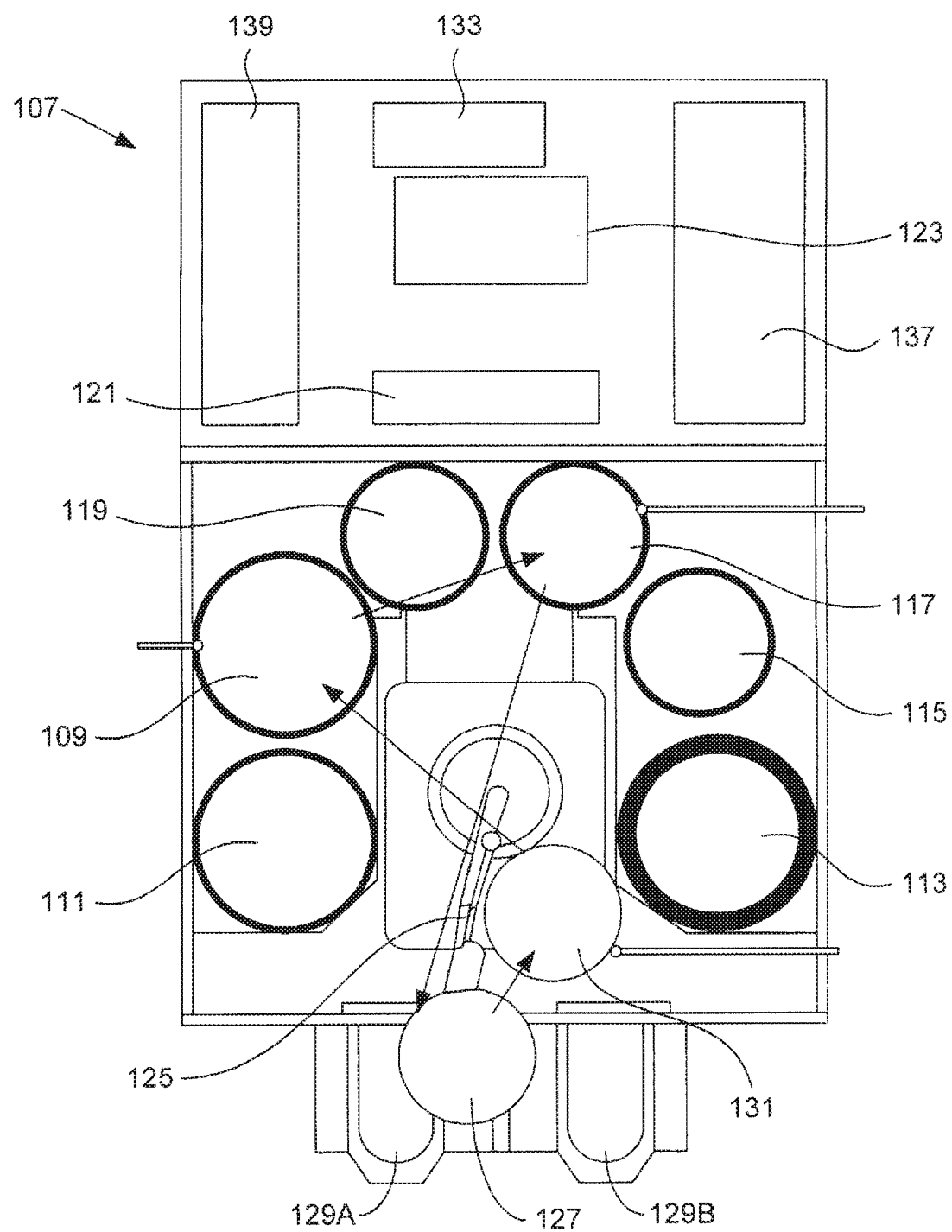
FIG. 1 is a block diagram illustrating a group of modules used to form copper lines in a Damascene process.

FIG. 1 depicts an electrofill system 107 which includes three separate electrofill modules 109, 111 and 113. System 107 also includes three separate post electrofill modules 115, 117 and 119. Each of these may be employed to perform each of the following functions: edge bevel removal, backside etching, and acid cleaning of wafers after they have been electrofilled by one of modules 109, 111, and 113. System 107 also includes a chemical dilution module 121 and a central electrofill bath 123. This is a tank that holds the chemical solution used as the electroplating bath in the electrofill modules. System 107 also includes a dosing system 133 that stores and delivers chemical additives for the plating bath. The chemical dilution module 121 stores and mixes chemicals to be used as the etchant in the post electrofill modules. A filtration and pumping unit 137 filters the plating solution for central bath 123 and pumps it to the electrofill modules. Finally, an electronics unit 139 provides the electronic and interface controls required to operate system 107. Unit 139 may also provide a power supply for the system. In operation, a robot including a robot arm 125 selects wafers such as a wafer 127 from a wafer cassette such as a cassette 129A or a cassette 129B. Robot arm 125 may be attached to the wafer 127 using a vacuum attachment.

To ensure that wafer 127 is properly aligned on robot arm 125 for precision delivery to an electrofill module, robot arm 125 transports wafer 127 to an aligner 131. In a preferred embodiment, aligner 131 includes alignment arms against which robot arm 125 pushes wafer 127. When wafer 127 is properly aligned against the alignment arms, the robot arm 125 moves to a preset position with respect to the alignment arms. It then reattaches to wafer 127 and delivers it to one of the electrofill modules such as electrofill module 109. There, wafer 127 is electrofilled with copper metal. Electrofill module 109 employs electrolyte from a central bath 123.

After the electrofill operation completes, robot arm 125 removes wafer 127 from electrofill module 109 and transports it to one of the post-electrofill modules such as module 117. There unwanted copper from certain locations on the wafer (namely the edge bevel region and the backside) is etched away by an etchant solution provided by chemical dilution module 121.

Preferably wafer 127 is precisely aligned within post electrofill module 117 without making use of aligner 131. To this end, the post electrofill modules may be provided with an alignment chuck as referenced elsewhere herein. In alternative embodiment, wafer 127 is separately aligned within aligner 131 after electrofill and prior to edge bevel removal in module 117.

After processing in post electrofill module 117 is complete, robot arm 125 retrieves wafer 127 from the module and returns it to cassette 129A. From there the cassettes can be provided to other systems such as a chemical mechanical polishing system for further processing.

Figure 2:
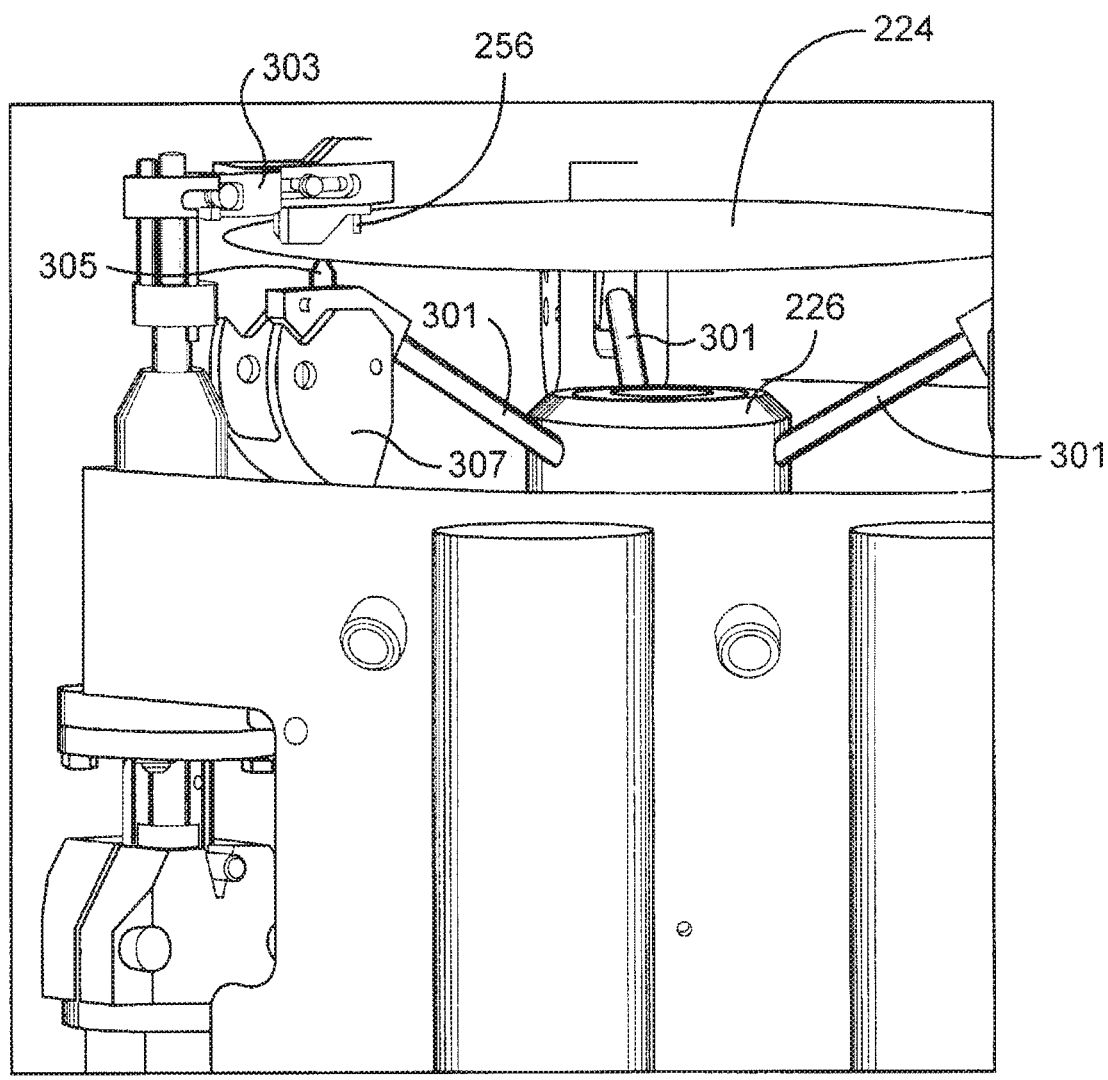
FIG. 2 is a perspective diagram of edge bevel removal (EBR) components that can be used in a post-electrofill module.

FIG. 2 schematically illustrates a post-electrofill module which includes a chamber in which a semiconductor wafer 224 rotates. Wafer 224 resides on a wafer chuck 226 which imparts rotational motion to wafer 224. The chamber is outfitted with a drain and associated drain line which allows the various liquid streams provided to chamber to be removed for waste treatment.

A motor controls the rotation of chuck 226. The motor should be easy to control and should smoothly transition between various rotational speeds. It may reside within or without chamber. In some embodiments, to protect against damage from liquid etchant, the motor resides outside of the chamber and is separated therefrom by a seal through which a rotating shaft passes. Any wobble in the shaft on rotation should be small (<0.05 millimeters for example) so that the location of fluid nozzles with respect to the wafer does not vary substantially, nor shake the wafer from its center while it is not confined by alignment or clamping members. Preferably, motor can rapidly accelerate and decelerate (in a controlled fashion) chuck 226 and wafer 224 at rotation rates between 0 and about 2000 rpm. The motor speed and other operations should be controllable by a computer.

Chuck 226 may be of any suitable design that holds wafer 224 in position during various rotational speeds. It may also facilitate alignment of wafer 224 for the etching process. A few particularly preferred examples of wafer chucks are described below.

The chamber may be of any suitable design that confines the liquid etchant within its interior and allows delivery of the various fluids to wafer 224. It should be constructed of an etchant resistant material and include ports and nozzles for the various liquid and gaseous streams used during etching and cleaning.

The EBR process 200 can be carried out by a post-electrofill module. The process begins with a robot arm placing the wafer on the module chuck for EBR processing. The wafer is typically aligned and placed on a set of support pins that hold the wafer in place by static friction, even when the wafer is later rotated. After the robot arm retracts, deionized water is applied to the front of the wafer and the wafer is spun at about 200-400 rpm in order to pre-rinse the wafer of any particles and contaminants left over from previous steps. The deionized water is then turned off and the wafer is spun up to a speed of between about 350-500 rpm, which creates a uniformly thin layer of deionized water (wet-film stabilization). This wet-film stabilization facilitates an even distribution of the etchant over the front side of the wafer. At this time, at the latest, any alignment pins or clamps that were used to precisely align the wafer in the chuck are retracted from the edge of the wafer.

After wet-film stabilization, actual removal of the edge bevel metal is performed. The EBR etchant is typically applied to the surface of the wafer using a thin nozzle tube, which has a nozzle opening at or near its end. When dispensing a small amount of fluid onto a surface as such, three flow regimes can generally result. The first regime is edge beading, where surface tension forces dominate the behavior of the fluid, the second is viscous flow, where viscous forces predominate, and the third is inertial, where inertial forces predominate and the fluid tends to spray. In a specific example, an EBR dispense arm is positioned over the wafer edge and EBR is performed under the following conditions: a total of about 2 to 4 milliliters etchant is delivered at a rate of about 0.25 to 2 milliliters/second (more preferably about 0.5 to 1 milliliters/second) for a 200 millimeter wafer.

After the required amount of liquid etchant has been applied to the edge of the wafer, deionized water is again applied to the front side of the wafer as a post-EBR rinse. This application of deionized water will generally continue through the subsequent operations of backside etching and backside rinsing so as to protect the wafer from any extraneous backside etchant spray and damage. While the deionized water is applied, the dispense arm moves the etchant nozzle away from the wafer.

At generally about the same time, the backside of the wafer is pre-rinsed with deionized water, which is wet-film stabilized in much the same manner that the front side of the wafer was (e.g., the wafer rotation speed is held at about 350 to 500 rpm). After the flow of deionized water to the wafer backside ends, a backside etch (BSE) operation is performed—generally with the same etchant that was used for the EBR. In a specific embodiment, a thin jet (initially 0.02 to 0.04 inches in diameter) of liquid etchant is aimed at the center of the wafer backside. The etchant is preferably delivered from a tubular nozzle having a diameter of about 0.02 to 0.04 inches and a length of at least about 5 times the diameter. This etchant then disperses over the entire backside of the wafer. The purpose of the BSE is to remove any residual copper that was formed on the backside of the wafer during formation of the seed layer of PVD copper.

The BSE etchant is typically applied using a spray nozzle. Despite gravity, surface tension generally keeps the etchant in contact with the bottom of the wafer long enough to carry out BSE. Since the chuck arms could interfere with the spraying of etchant on the backside of the wafer, the angle of the spray nozzle may be varied during BSE to ensure thorough application of the etchant. Because the wafer is generally held up by support pins that impinge on the backside of the wafer, the process is generally carried out at two different speeds to ensure that the etchant flows adequately over the entire surface. For instance, the wafer may be rotated at about 350 rpm during part of the BSE and then rotated at 500-700 rpm for the remainder of the BSE. The portions of the backside blocked by the arms will differ at the two speeds, thus ensuring complete coverage. Overall, the BSE process typically takes 1-4 seconds and uses 1 to 5 cubic centimeters of the preferred etchant described below to reduce the concentration of copper on the backside to less than $5 \cdot 10^{-10}$ atoms per $cm^2$ of substrate.

After BSE, both sides of the wafer (or at least the backside of the wafer) are rinsed with deionized water to rinse any liquid etchant, particles and contaminants remaining from the BSE. Then the flow of deionized water to the front side ends and about 2 to 4 milliliters of a dilute acid, generally less than about 15% by weight acid, is applied to the front side of the wafer to remove residual metal oxide and remove the associated discoloration. In a specific embodiment, the acid is applied at a rate of about 2 cc/sec. After the acid rinse, deionized water is once again applied to both sides of the wafer, or at least the front side, to rinse the acid from the wafer. In a specific embodiment, the deionized water is applied for about 15-30 seconds at about 300-400 milliliters/min. Finally the wafer can be spun and blow-dried, as desired, on both sides with nitrogen. Generally, any drying step is carried out at about 750-2000 rpm for about 10 to 60 seconds, and necessitates a clamping for the wafer once it reaches about 750 rpm. Many embodiments for the clamping mechanism are possible, and some of these are discussed in more detail below. After this processing in the PEM is completed, a robot arm picks up the wafer and puts it in a cassette.

Turning again to FIGS. 1 and 2, some features of the PEM will be described in further detail. First, note that wafer 224 rides on support pins 305 (located on wafer chuck arms 301) by static friction. Preferably, the support pins 305 are located from about 5 to 20 millimeters, more preferably about 5 to 10 millimeters, in from the edge of wafer 224. The design of the support pins is determined by the need to supply enough friction to (1) keep the wafer from flying off the chuck if it is aligned slightly off center (i.e. when aligned to the tolerance of the specification of the edge bevel removal process), (2) not slip as the wafer is accelerated (at typically a rate of 50 to 300 rpm/sec (100 rpm/sec in a specific embodiment)) from rest to the EBR rotation rate, and (3) not shed or generate particles. As the wafer's rotational speed increases, however, it reaches a velocity at which the static friction from resting on the pins can no longer constrain it due to small misalignments and the associated centripetal force. To prevent the wafer from flying off chuck 226 at such velocities, clamping cams 307 may be employed. The design of suitable cams is described below. For now, simply understand that at defined wafer rotational velocities, the clamping cams rotate into a position that locks wafer 224 in place.

Next note that a dispense-arm 303 functions to hold a dispense nozzle 256 and move the nozzle into an accurately controlled location over the wafer 224 during the etching step of the process. The dispense-arm design is not particularly restrictive. It can move down from above the wafer, in from the side, swing in from the edge, rotate down from above, or any combination of these movements. However, the location of the nozzle is preferably reproducibly accurate to within less than about 0.5 mm (more typically less than about 0.2 mm) so that the entire etched region is mechanically under control. Any suitable pneumatic actuator, solenoid, motor controlled gear, or servo controlled motor can activate the arm. The dispense-arm should move the dispense nozzle accurately to the edge of the wafer and move the nozzle out of the way to allow the wafer to be transferred into and out of the chuck. The materials of construction should be resistant to the particular chemical etching solution used. If the preferred etchant disclosed herein is used, certain stainless steels (e.g. 303, 625, 316L etc.), ceramics ($Al_2O_3$, zirconia), Tantalum, and plastic coated metals (polypropylene, polyethylene, PTFE, PVDF) are good choices because they will resist chemical attack, and have sufficient mechanical strength (without creep or flow) to maintain the necessary stringent mechanical tolerances. Similar design considerations hold for the wafer chuck.

Figure 3:
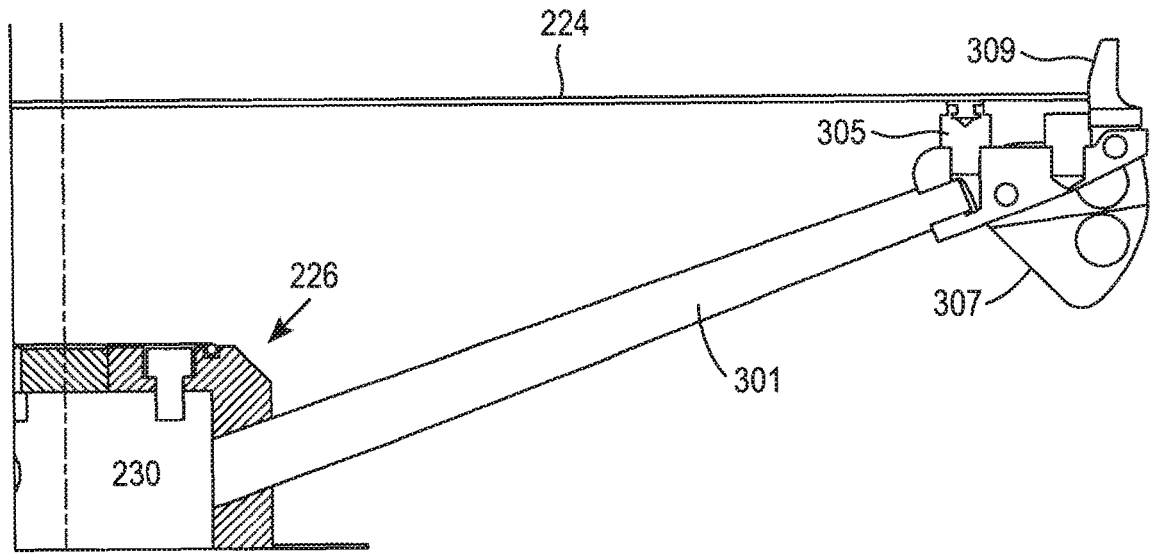
FIG. 3 shows details of the support arms, support pins and alignment cams of a chuck useful for EBR.

As shown in FIG. 3, chuck 226 includes a rotatable center hub 230 having a plurality of support arms 301 extending outwardly from the rotatable center hub. Support pins 305 are located on ends of the support arms 301. In an embodiment described below in connection with FIG. 4, the support arm can include a gas conduit in fluid communication with a gas passage in the support pin 305. The support pin is preferably a rubber cup mounted on a metal support at the end of the support arm 301.

In the FIG. 3 embodiment, the alignment cam 307 is a multi-piece component which include a pivotable centering finger 309 which can be rotated from an inward position at which the wafer is centered to an outward position (not shown) away from the outer periphery of the wafer. To prevent the wafer from slipping off of the support pins 305 during rotation of the chuck 226, at a certain rotational speed, centrifugal force causes a component of the alignment cam to swing outward and cause the centering finger 309 to pivot to the inward position. During some processing steps the alignment finger 309 can cause undesirable splashing of liquids and lead to non-uniform cleaning of the wafer.

Figure 4:
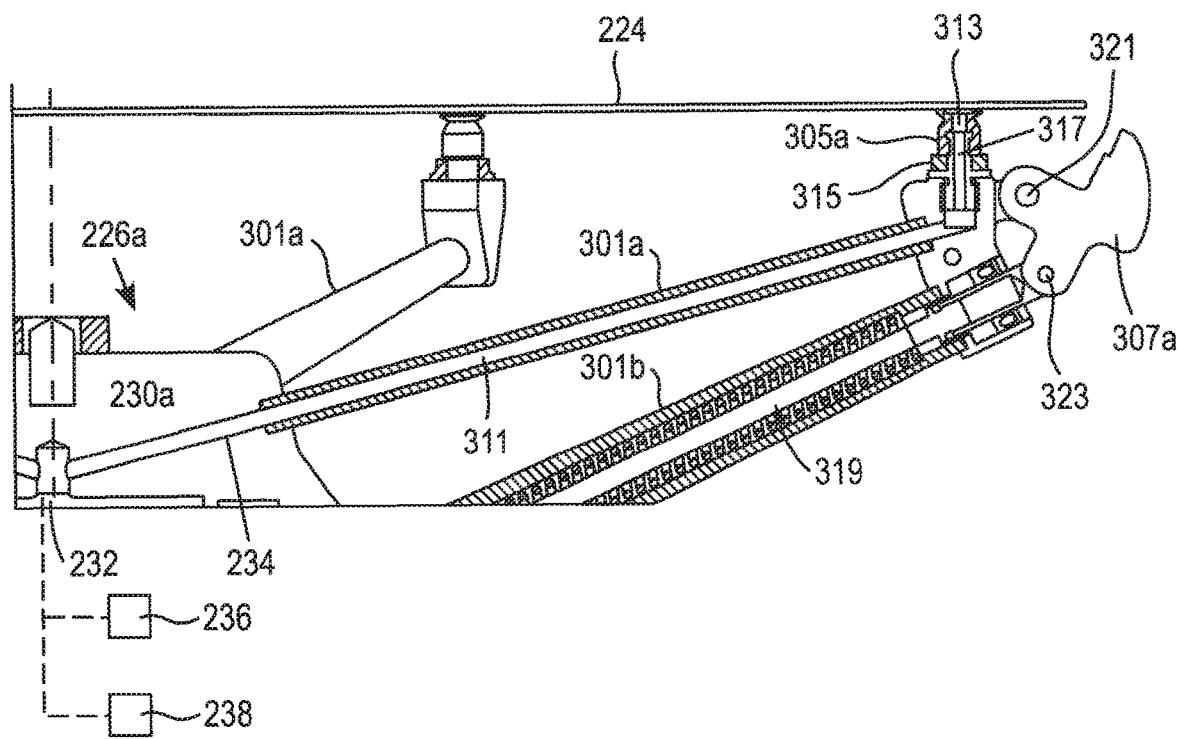
FIG. 4 shows details of a support arm of a chuck wherein gas can be used to float a wafer during centering and vacuum can be applied to the wafer during EBR.

To address this problem, the chuck 226a shown in FIG. 4 includes support arms 301a which have gas conduits 311 therein and support pins 305a include gas passages 313 therein which allow the wafer 224 to be floated on a gas cushion during centering and vacuum clamped during EBR processing. The support pins 305a are preferably rubber cups mounted on metal supports 315 having bores 317 connecting the fluid conduits 311 to the gas passages 313.

The FIG. 4 embodiment also includes a modified alignment cam 307a wherein a supplemental support arm 301b includes an actuating rod 319 therein which can be moved outwardly away from the center hub 230 to pivot the alignment cam 307a. As shown in FIG. 4, the alignment cam 307a has an upper pivot connection 321 and a lower pivot connection 323. The outer end of the actuating rod 319 is attached to lower pivot connection 323 and the alignment cam 307a is attached to the upper pivot connection 321. Thus, when the actuating rod 319 is moved away from the center hub 230, the upper end of the alignment cam 307a is moved inward toward the outer periphery of the wafer 224 to center the wafer 224 or prevent the wafer 224 from slipping off of the support pins 305a during high speed rotation of the chuck 226.

As shown in FIG. 4, the gas conduits 311 in the support arms 301a can supply gas to the gas passages 313 to float the wafer 224 above the support pins 305a or apply a vacuum to the gas passages 313 to vacuum clamp the wafer 224 on the support pins 305a. To float a wafer above the support pins 305a, gas can be supplied to the gas passages 313 at 1 psi or higher in a pulse lasting a short duration such as 0.5 to 5 seconds, preferably about 1 second. For example, nitrogen can be supplied to the gas passages at 1 to 5 psi, preferably about 2 psi to float the wafer during wafer centering.

In a preferred embodiment, the chuck 226a includes six support arms 301a, each of the support arms having a gas delivery conduit 311 in fluid communication with a respective one of the gas passages 313 in the support pins 305a. The support arms 301b include alignment cams 307a which are rotatable from an outer non-alignment position away from a periphery of the wafer 224 to an inner alignment position at which the wafer 224 is centered, as shown in FIG. 4. To supply gas or apply a vacuum force to the gas outlets in the support pins 305a, the rotatable center hub 230a can have a gas inlet 232 and a plurality of gas delivery ports 234 in fluid communication with the gas delivery conduits 311 in the support arms 301a. Gas can be supplied to the gas outlets by a source of pressurized gas 236 connected to the gas inlet 232 and suction can be applied to the gas outlets by a vacuum source 238 connected to the gas inlet.

As described above, the alignment cams 307a can include upper pivot connections 321 and lower pivot connections 323, wherein the rotatable cams 307a are rotatable about the upper pivot connections by actuating rods 319 attached to the lower pivot connections 323. In one arrangement, the chuck 226a includes six support arms located at radial positions of 60° 120°, 180°, 240°, 300° and 360°, the support arms at radial positions 60°, 180° and 300° including the alignment cams 307a and the support arms at radial positions 120°, 240° and 360° not including the alignment cams 307a. The support arms having alignment cams 307a can include upper arms 301a with the gas delivery conduits 311 therein and lower arms 301b having actuating rods 319 therein, the actuating rods 319 attached to the alignment cams 307a such that upper ends of the alignment cams 307a are rotated toward the periphery of the wafer 224 when ends of the actuating rods 319 move outward from the center hub 230a and are rotated away from the periphery of the wafer 224 when ends of the actuating rods 319 move towards the center hub 230a. During centering of a wafer, a robot drops the wafer onto the support pins 305a and while the wafer 224 is supported on the pins 305a, gas is supplied to the gas passages 313 at a pressure sufficient to float the wafer above the support pins 305a and the alignment cams 307a are rotated from outer positions to inner positions at which one or more alignment cams 307a contact the periphery of the wafer and move the wafer to a position at which the center of the wafer aligns with the center axis of the chuck 226a.

A typical Damascene process begins with formation of line paths in a previously formed dielectric layer, which may be etched with trenches and vias. The lines define conductive routes between various devices on a semiconductor wafer to be filed with conductive materials. The process continues with depositing a thin diffusion barrier layer to prevent diffusion of the conductive materials into the dielectric layer. Suitable materials for the diffusion barrier layer include tantalum, tantalum nitride, tungsten, titanium, and titanium tungsten. In a typical embodiment, the barrier layer is formed by a PVD process such as sputtering. The next following operation involves depositing a conductive seed layer to provide a uniform conductive surface for current passage during an electrofill operation. A PVD method may be employed for this operation. The wafer is then electrofilled with a thicker layer of copper over the seed layer. Electrofilling continues until the line paths completely filled to the top surface of the dielectric.

It is desirable to use as much of the wafer surface for active circuitry as possible. While it is generally possible to provide some shielding during electroplating, similar shielding is not as straightforward for PVD. Therefore, during the PVD seed layer formation copper is deposited in some unwanted areas, such as bevel edge region. Thick copper deposition may result in higher currents in this area during the electrofill adding even more metal into the undesirable areas forming a bevel-like shape on the edge of the wafer. This bevel may easily break away during later CMP and damage devices on the surface of the wafer. As a result, the bevel must be removed, which is accomplished by the EBR and/or backside etch (BSE) processes.

With EBR, etchant is applied to the front edge of the wafer in a thin stream. In certain embodiments, the etchant is applied under viscous flow conditions to remain thin over the thinned layer of the pre-rinse liquid. The etchant is generally applied with some radial velocity corresponding to the flow rate and nozzle orientation. Additionally, the etchant is forced to the edge of the wafer by the centrifugal force resulting from the rotation of the wafer. The combination of these two forces with gravitational force and surface tension, causes the etchant to flow outward, and down over the side edge and onto a few millimeters onto the backside, thus accomplishing removal of the unwanted metal from all three of these areas. After EBR, the electroplated copper is planarized, generally by CMP down to the dielectric in preparation for further processing, generally the addition of subsequent dielectric and metalization layers.

EBR Process Details

The wafer begins to spin at, e.g., about 150-400 rpm and deionized water is applied to the front of the wafer. Wafer rotation serves to evenly distribute the applied deionized water over the wafer surface and to remove the excess of water from the wafer from surface. This pre-rinsing removes particles and contaminants left over from previous processing steps. Moreover, pre-rinse wets the front side of the wafer that may be dry after the previous processing steps. In one embodiment, the pre-rinse operation employs only deionized water and no acid. The pre-rinse operation takes place anywhere between 1 to 5 seconds with a flow rate of 200-800 ml/minute depending on rinse water temperature, plating chemistry, deionized water flow rate and the rotational speed of the wafer. It is sometime desirable to use hot rinse water to accelerate the pre-rinse efficiency. Therefore, DI water at from 20 to 50° C. can be employed depending on the economics of the operations.

Creating a uniform water film on the wafer surface is frequently desirable. Using a "clamshell" or other wafer clamping tool that excludes the wafer edge during plating often results in parts of wafer edges being dry, while other being wet. An etching process may be ineffective and even damaging to the wafer if etchant is distributed over an unevenly wetted edge.

It may be desirable to have a uniform but thin layer of water in the areas where etchant is applied. A thinner film provides for faster diffusion of the etchant to the metal and smaller taper width on the etched edge of the metal. To produce a thinner film, the deionized water is turned off after pre-rinse operation, and the wafer rotational speed is increased substantially (e.g., to about 400-1300 rpm in certain embodiments) for approximately a relatively short duration (e.g., about 1 to 5 seconds in certain embodiments) allowing for wet film thinning. In a specific embodiment, the wafer is rotated at about 600-1200 rpm for approximately 1.5-3 seconds. These parameters may depend on the wafer size, surface tension of the pre-rinse liquid that may be modified with various surfactants, and other factors. Higher rotation speed leads to greater centrifugal force experienced by the layer of the pre-rinse liquid. This force is directed away from the center of the wafer and therefore removes some of the pre-rinsed liquid from the wafer. Moreover, higher centrifugal forces may provide better uniformity of the layer. Further, the higher rotational speeds of the wet film thinning operation enhance evaporation of the pre-rinse liquid from the surface of the wafer further thinning the layer of the remaining liquid. However, rotation speeds should not exceed levels at which thin water layer loses its uniformity, i.e. breaks apart, or wafer loses its alignment.

The wet film thinning operation may include delivering of thinning fluid to the edge area or to the entire surface of the wafer. Thinning fluids may reduce the surface tension and increase vapor pressure of the resulting solution. Lowered surface tension changes the contact angle of the layer at the edge bevel area leading to a smaller bead. At the same time, higher vapor pressures increase evaporation. For example, a high vapor pressure organic solvent, like isopropyl alcohol ("IPA"), may be delivered on the top of the pre-rinsed liquid through a nozzle similar to delivering of the etchant during the EBR operation.

The thinning fluid may be also pre-heated and be applied together with other liquids or carrier gases to further heat the edge liquid and thin down the liquid layer further reducing the surface tension and viscosity. The thinning fluids may be delivered right after the pre-rinse operation and before the wafer is accelerated. In another embodiment, thinning fluids may be applied during or after acceleration of the wafer.

The wet film thinning operation may include use of an impinging flowing gas to help physically remove excess fluid from the periphery. In such operation, a directed jet of gas flowing through a nozzle near the wafer periphery imparts momentum and an added force on the liquid bed, forcing entrained fluid outward and away from the bevel and allowing it to be quickly thinned.

In an alternative approach typically requiring a lower velocity and rate of flowing gas, an edge liquid bead thinning technique imparts a liquid-surface-tension-reducing gas stream, typically an organic compound in gas, vapor, or aerosol form, blown through a nozzle onto the surface of the liquid edge bead layer. Molecules of the surface-tension-lowering stream are adsorbed into the liquid layer on the wafer surface. By passing a soluble and surface tension lowering adsorbate over the air-liquid interface, the air-liquid interfacial tension of the fluid adhering to a wafer is reduced, thereby altering the balance of forces between centrifugal and surface tension forces and allowing the bead to be thinned. Suitable surface tension reducing chemicals tend to be volatile, soluble in the water, and have some spatially separated polar and non-polar molecular groups so that, like most surfactants, they can align non-polar groups to the surface and polar groups with the internal regions of the fluid, thereby reducing surface energies and forces. Isopropyl alcohol (IPA) is one typical example of a chemical used in a vapor or an aerosol form to achieve this liquid-layer thinning result. Other examples include other alcohols (ethanol, butanol), amines (ethyl and propylamine), ketones (MEK) and aldehydes (acetylaldehyde) that have hydrophilic and hydrophobic molecular groups. From a different perspective, the thinning liquid may be chosen to significantly increase the vapor pressure of the prerinse liquid. In one embodiment, ultrasonic oscillation operating at 25-120 kHz may be used to create IPA aerosol and aid in the rapid diffusion of gas into the edge bead fluid. Typically, IPA is fed at about 1 ml/min to 100 ml/min at a mole fraction of 2 to 30% in a carrying gas (e.g. nitrogen), depending on the configuration of the nozzle and other process parameters. Other vapors and aerosols may also be used and combination of physical (force of flowing gas) and chemical (reduced surface tension) removal of the bead are also possible.

The film thinning operation produces a generally uniform thin aqueous layer. The etchant is then delivered, as depicted in an EBR operation, on the top of this aqueous layer in the edge areas of the wafer and diffuses through the layer to contact the metal. A thinner pre-rinse layer provide for faster etchant diffusion and less dilution. Moreover, the etchant is localized in the edge area rather than diffusing through the aqueous layer towards the center of the wafer leading to increased taper width.

The process continues with an edge bevel removal (EBR) operation. In certain embodiments, the wafer is rotated at about 150-400 rpm, more preferably about 200 to 250 rpm for 200 mm wafers and about 175 to 225 rpm for 300 mm wafers. This rotational speed ensures coverage of the entire edge area with the EBR etchant. The acceleration of the wafer during the wet film thinning operation and deceleration during the EBR operation may be performed at rates that ensure continued alignment of the wafer in the chuck. In certain embodiments, the rotational rate does not exceed about 150 rpm/sec when using typical plastic support pins (e.g., PPS or PVDF). Pins with greater friction coefficient may be used as long as they do not flake or generate particles.

The EBR etchant and the edge bead liquid surface tension reducing stream are typically applied to the surface of the wafer using a thin tube with a nozzle opening at or near its end. When dispensing a small amount of etchant onto a surface as such, three flow regimes can generally result, any of which may be appropriate. The first regime is edge beading, where surface tension forces dominate the behavior of the fluid, the second is viscous flow, where viscous forces predominate, and the third is inertial, where inertial forces predominate and the fluid tends to spray. The EBR operation can be performed under the following conditions: a total of about 2 to 14 milliliters etchant is delivered at a rate of about 0.25 to 2 milliliters/second (more preferably about 0.3 to 0.5 milliliters/second). The amount delivered depends on the film thickness to be removed, size of the wafer, the concentration of chemical etchant, rotation rate and etchant temperature.

The etchant can be delivered in several stages. For example, the etchant may be delivered in two stages: a high flow rate stage followed by a lower flow rate stage. During the high flow rates stage the etchant may be delivered at about 0.25-0.35 ml/s for about 1-5 seconds followed by the low flow rate stage with delivery rate of about 0.10-0.20 ml/s for about 10-30 sec. The high flow rate stage helps the EBR etchant overcome the surface tension resistance of the pre-rinse film and rapidly diffuse through the layer. At this stage, diffusion of the etchant within the film is facilitated because the film is originally free from etchant. However, the duration of this stage should not exceed the time required for the etchant to saturate the film. The low flow rate stage then supplies the bulk of the etchant for EBR. The flow rate should be small enough to prevent excessive diffusion of the etchant into the active part of the wafer, which may result in the wider taper. The delivery rate and the duration at this stage may depend on a wafer diameter (length of the edge bevel), bevel thickness, pre-rinse film thickness, and other factors. Excessive etchant may result in wider taper width. In a specific embodiment optimized for up to about 0.75 micrometer thick bevels on a 300-mm wafer, about 2-4 ml of etchant is delivered over a period of approximately 15-20 seconds.

The etchant may include an acid and oxidizer. Examples of acids that are useful include sulfuric acid, hydrohalic acids, chromic acid and nitric acid. In one embodiment, the etchant for copper EBR may be a solution of $H_2SO_4$ (sulfuric acid) and $H_2O_2$ (hydrogen peroxide) in water. In one specific embodiment, the etchant comprises between about 15% to 25% $H_2SO_4$ by weight and 20% to 35% $H_2O_2$ by weight. A thinner film of the pre-rinsed liquid may allow higher acid concentration in the etchant. Other oxidants, such as peroxydisulfate $S_2O_8^{-2}$ and concentrated $HNO_3$ (about 30% in water), may be used. Near neutral and alkaline etchants which tend to complex with the dissolved metal can also be employed, such as combinations of glycine or ethylene diamine and hydrogen peroxide at a pH of around 9. Generally, the liquid etchant should have physical properties compatible with the etching system, such as surface tension, contact angle, and viscosity.

After the required amount of liquid etchant has been applied to the edge of the wafer, deionized water may be applied to the front side of the wafer as a post-EBR rinse. Deionized water may be applied to the entire wafer as a whole and not just the wafer edge. This application of deionized water will generally continue through the subsequent operations of backside etching and backside rinsing so as to protect the wafer from any extraneous backside etchant spray and damage. While the deionized water is applied, the dispense arm moves the etchant nozzle away from the wafer.

Although the foregoing invention has been described in some detail for purposes of clarity of understanding, it will be apparent that certain changes and modifications may be practiced within the scope of the appended claims. It should be noted that there are many alternative ways of implementing the present invention. Accordingly, the present embodiments are to be considered as illustrative and not restrictive, and the invention is not to be limited to the details given herein. All references cited herein are incorporated by reference for all purposes.

What is claimed is:

1. A method of centering a semiconductor wafer, the method comprising:
    (a) transferring a wafer above a rotatable chuck having at least three support arms with support pins at outer portions of the support arms;
    (b) lowering the wafer onto the support pins;
    (c) supplying pressurized gas to gas passages within the support pins, the support pins having gas outlets in an upper surface of the support pins such that the wafer floats on gas cushions formed by gas flowing out of the gas outlets in the upper surfaces of the support pins;
    (d) centering the wafer by moving the wafer across the support pins while the wafer floats on the gas cushions; and
    (e) applying vacuum to the gas passages within the support pins such that the water is vacuum clamped to the upper surface of each wafer support pin, thereby enabling at least one cycle of wafer flotation and vacuum clamping of the same water on the same support pins during a wafer treatment process.

2. The method of claim 1, further comprising:
    (f) rotating the wafer;
    (g) pre-rinsing the wafer using a pre-rinse liquid comprising deionized water;
    (h) thinning a layer of the pre-rinse liquid by increasing a rotational speed of the wafer; and
    (i) delivering a stream of liquid etchant into the thinned layer of pre-rinse liquid near an edge bevel area of the wafer such that the liquid etchant diffuses through the thinned layer of pre-rinse liquid and substantially removes unwanted metal selectively from the edge bevel area.

3. The method of claim 2, wherein alignment cams are pivotally attached to the support arms so as to be movable between alignment positions at which upper portions of the alignment cams center the wafer and non-alignment positions at which the upper portions of the alignment cams are located below the wafer, the method further comprising:
    (j) rotating the alignment cams to the alignment positions; and
    (k) drying the wafer by rotating the wafer at a drying speed of at least 750 rpm while applying vacuum to the gas passages such that the wafer is vacuum clamped to the support pins.

4. The method of claim 1, wherein the chuck includes six support arms, each of the support arms having a gas delivery conduit in fluid communication with a respective one of the gas passages in the support pins, wherein during operation (c) gas flows out of the gas outlets in the upper surfaces of the six support pins.

5. The method of claim 1, wherein the chuck includes six support arms, each of the support arms having a gas delivery conduit in fluid communication with a respective one of the gas passages in the support pins, wherein during operation (e) vacuum is applied to each of the six gas passages.

6. The method of claim 1, wherein the gas is delivered to the gas passages at a pressure of at least one psi.

7. The method of claim 1, wherein the support arms include rotatable alignment cams, wherein during operation (d) the alignment cams are rotated from an outer position away, from a periphery of the wafer to an inner position at which the wafer is centered and gas is supplied to the gas passages in a pulse as the alignment cams approach the outer periphery of the wafer.

8. The method of claim 7, wherein the alignment cams include upper pivot connections and lower pivot connections, wherein during operation (d) the alignment cams are rotated about the upper pivot connections by rods attached to the lower pivot connections.

9. The method of claim 1, wherein the support arms extend outwardly from a rotatable center hub, the rotatable center hub having a gas inlet and a plurality of gas delivery ports in fluid communication with gas delivery conduits in the support arms, wherein during operation (c) gas is supplied to the gas inlet and flows out of the gas delivery ports to the gas passages in the support pins.

10. The method of claim 9, wherein during operation (e) a vacuum force is applied to the gas inlet and suction is applied to locations on an underside of the wafer by the support pins.

11. A method of centering a semiconductor wafer, the method comprising:
    supporting a wafer above a rotatable chuck, the chuck including at least three support arms and an array of support pins and gas outlets, each support arm including a respective support pin disposed at an outer portion of a respective support arm, each support pin including one of the gas outlets disposed in an upper surface thereof;

lowering the wafer onto the array of support pins;

supplying pressurized gas to the gas outlets such that e wafer floats on gas cushions formed by gas flowing out of the gas outlets;

centering the wafer by moving the water across the support pins while the wafer floats on the gas cushions; and applying vacuum to the gas outlets such that the wafer is vacuum clamped to the upper surface of each support pin, thereby enabling at least one cycle of wafer flotation and vacuum clamping of the same wafer on the same support pins during a wafer treatment process.

12. The method of claim 11, further comprising:

rotating the wafer;

pre-rinsing the wafer with a pre-rinse liquid;

thinning a layer of the pre-rinse liquid by increasing a rotational speed of the wafer; and delivering a stream of liquid etchant into the thinned layer of pre-rinse liquid near an edge bevel area of the wafer such that the liquid etchant diffuses through the thinned layer of pre-rinse liquid and substantially removes unwanted metal selectively from the edge bevel area.

13. The method of claim 11, wherein the chuck includes six support arms, each of the support arms including a gas delivery conduit in fluid communication with a respective one of the gas outlets, and wherein the gas cushions are formed by gas flowing out of the gas outlets in the upper surfaces of the support pins.

14. The method of claim 11, wherein the chuck includes six support arms, each of the support arms including a gas delivery conduit in fluid communication with a respective one of the gas outlets in the support pins, the method further comprising applying vacuum to each of the gas outlets.

15. The method of claim 14, wherein the gas is delivered to a gas delivery conduit at a pressure of at least one psi.

16. The method of claim 14, wherein the support arms include rotatable alignment cams, and wherein the method further includes:

rotating the alignment cams from an outer position away from an outer periphery of the wafer to an inner position at which the wafer is centered; and supplying gas to the gas delivery conduit in a pulse as the rotatable alignment cams approach the outer periphery of the wafer.

17. The method of claim 16, wherein the alignment cams include upper pivot connections and lower pivot connections, and wherein the method further comprises rotating the alignment cams about the upper pivot connections by rods attached to the lower pivot connections.

18. The method of claim 11, further comprising:

providing alignment cams pivotally attached to the support arms so as to be movable between alignment positions at which upper portions of the alignment cams center the wafer and non-alignment positions at which the upper portions of the alignment cams are located below the wafer;

rotating the alignment cams to the alignment positions; and drying the wafer by rotating the wafer at a drying speed of at least 750 rpm while applying vacuum to the gas passages such that the wafer is vacuum clamped to the support pins.

19. The method of claim 11, wherein the support arms extend outwardly from a rotatable center hub, the rotatable center hub having a gas inlet and a plurality of gas delivery ports in fluid communication with gas delivery conduits provided in the support arms, and wherein the method further comprises supplying gas to the gas inlet for delivery to the gas outlets in the support pins via the plurality of gas delivery ports of the rotatable center hub.

20. The method of claim 19, further comprising applying a vacuum to the gas inlet of the center hub such that a suction is applied to locations on an underside of the wafer by the gas outlets of the support pins.

* * * * *